(12) United States Patent
Wang et al.

(10) Patent No.: US 12,156,408 B2
(45) Date of Patent: *Nov. 26, 2024

(54) SEMICONDUCTOR DEVICE COMPRISING MAGNETIC TUNNELING JUNCTIONS WITH DIFFERENT DISTANCES/WIDTHS IN A MAGNETORESISTIVE RANDOM ACCESS MEMORY

(71) Applicant: UNITED MICROELECTRONICS CORP., Hsin-Chu (TW)

(72) Inventors: Po-Wei Wang, Tainan (TW); Yi-An Shih, Changhua County (TW); Huan-Chi Ma, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/515,289

(22) Filed: Nov. 21, 2023

(65) Prior Publication Data

US 2024/0090233 A1 Mar. 14, 2024

Related U.S. Application Data

(63) Continuation of application No. 17/389,310, filed on Jul. 29, 2021, now Pat. No. 11,871,585.

(30) Foreign Application Priority Data

Jul. 2, 2021 (CN) .......................... 202110748672.0

(51) Int. Cl.
H10B 61/00 (2023.01)
H10N 50/85 (2023.01)

(52) U.S. Cl.
CPC ............. *H10B 61/00* (2023.02); *H10N 50/85* (2023.02)

(58) Field of Classification Search
CPC ........ H10B 61/00; H10N 50/10; H10N 50/85; H10N 59/00; G11C 11/161
USPC ............................................. 257/421; 438/48
See application file for complete search history.

(56) References Cited

U.S. PATENT DOCUMENTS

| 9,007,819 | B2 | 4/2015 | Ahn et al. | |
| 11,871,585 | B2 * | 1/2024 | Wang | H10N 50/10 |
| 2003/0218902 | A1 | 11/2003 | Perner | |
| 2005/0232006 | A1 | 10/2005 | Iwata | |
| 2009/0027955 | A1 | 1/2009 | Koh | |
| 2017/0076773 | A1 | 3/2017 | Noguchi | |
| 2021/0043683 | A1 | 2/2021 | Chiang | |

FOREIGN PATENT DOCUMENTS

TW I726022 B 5/2021

* cited by examiner

*Primary Examiner* — Didarul A Mazumder
(74) *Attorney, Agent, or Firm* — Winston Hsu

(57) ABSTRACT

A semiconductor device includes a sense amplifier, a first magnetic tunneling junction (MTJ) connected to the sense amplifier at a first distance, a second MTJ connected to the sense amplifier at a second distance, and a third MTJ connected to the sense amplifier at a third distance. Preferably, the first distance is less than the second distance, the second distance is less than the third distance, a critical dimension of the first MTJ is less than a critical dimension of the second MTJ, and the critical dimension of the second MTJ is less than a critical dimension of the third MTJ.

5 Claims, 2 Drawing Sheets

SEMICONDUCTOR DEVICE COMPRISING MAGNETIC TUNNELING JUNCTIONS WITH DIFFERENT DISTANCES/WIDTHS IN A MAGNETORESISTIVE RANDOM ACCESS MEMORY

CROSS REFERENCE TO RELATED APPLICATIONS

This application is a continuation application of U.S. application Ser. No. 17/389,310, filed on Jul. 29, 2021. The content of the application is incorporated herein by reference.

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a sense amplifier, a first magnetic tunneling junction (MTJ) connected to the sense amplifier at a first distance, a second MTJ connected to the sense amplifier at a second distance, and a third MTJ connected to the sense amplifier at a third distance. Preferably, the first distance is less than the second distance, the second distance is less than the third distance, a critical dimension of the first MTJ is less than a critical dimension of the second MTJ, and the critical dimension of the second MTJ is less than a critical dimension of the third MTJ.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
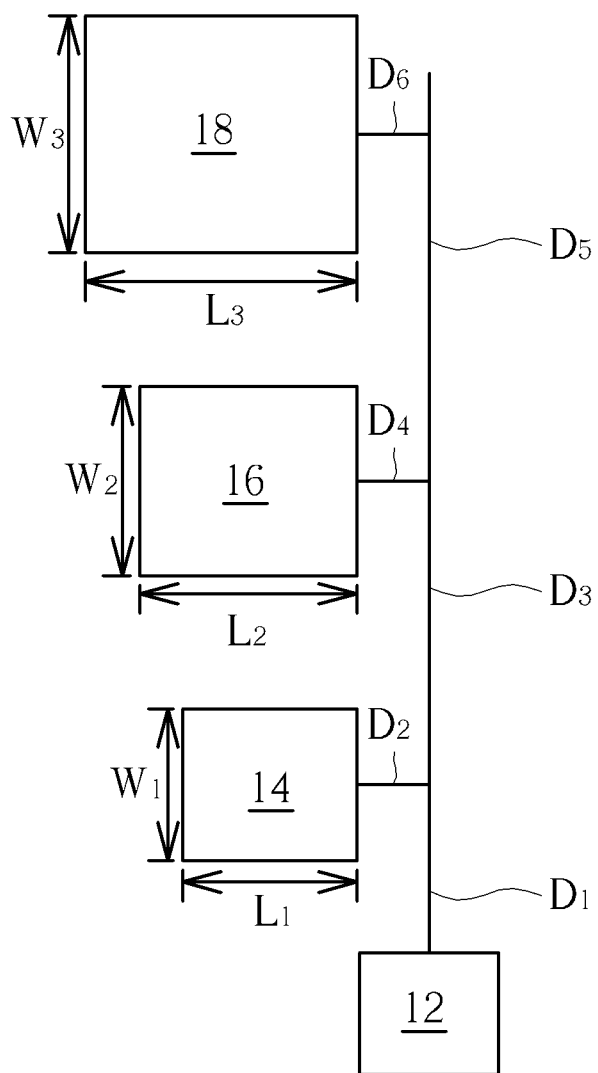
FIG. 1 illustrates a block diagram of a MRAM device according to an embodiment of the present invention.

Referring to FIG. 1, FIG. 1 illustrates a block diagram of a semiconductor device or more particularly a MRAM device according to an embodiment of the present invention. As shown in FIG. 1, the MRAM device includes a sense amplifier 12 and three MTJs connected to the sense amplifier 12 along different distances or paths, including a first MTJ 14 connected to the sense amplifier 12 at a first distance, a second MTJ 16 connected to the sense amplifier 12 at a second distance, and a third MTJ 18 connected to the sense amplifier 12 at a third distance. Typically, the sense amplifier serves to convert data stored in storage capacitor into voltages corresponding to logic 1 or 0 and display the results onto bit lines. In the meantime as a read operation is completed, electrical potentials in the storage capacitor are refreshed to original state through the bit lines.

In this embodiment, each of the first MTJ 14, the second MTJ 16, and the third MTJ 18 could include a bottom electrode, a pinned layer, a barrier layer, a free layer, and a top electrode. Preferably, the bottom electrode and the top electrode are made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide (AlOx) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

It should be noted that the distance between the MTJs and the sense amplifier is preferably inversely proportional to the critical dimension of each of the MTJs. For instance, the distance (such as a first distance) between the first MTJ 14 and the sense amplifier 12 is less than the distance (such as a second distance) between the second MTJ 14 and the sense amplifier 12 and the distance between the second MTJ 16 and the sense amplifier 12 is less than the distance (such as a third distance) between the third MTJ 18 and the sense amplifier 12. In the meantime, the critical dimension of the first MTJ 14 is less than the critical dimension of the second MTJ 16 and the critical dimension of the second MTJ 16 is less than the critical dimension of the third MTJ 18.

In this embodiment, the distance between the sense amplifier 12 and the MTJ could include or referred to as an overall length of metal interconnection of metal wirings physically connecting the sense amplifier 12 and the MTJs while the definition of critical dimension of the MTJs could include or referred to as a length of the entire MTJ, a width of the entire MTJ, or a sum of both length and width of the entire MTJ, in which the definition of entire MTJ could further include a length of the top electrode, the free layer, the barrier layer, the pinned layer, and/or the bottom electrode, a width of the top electrode, the free layer, the barrier layer, the pinned layer, and/or the bottom electrode, or a sum of both length and width of the top electrode, the free layer, the barrier layer, the pinned layer, and/or the bottom electrode.

As shown in FIG. 1, the distance (such as the first distance) between the first MTJ 14 and the sense amplifier 12 preferably includes a sum of distance $D_1$ and distance $D_2$, the distance (such as the second distance) between the second MTJ 16 and the sense amplifier 12 preferably includes a sum of distance $D_1$, distance $D_3$, and distance $D_4$, and the distance (such as the third distance) between the third MTJ 18 and the sense amplifier 12 preferably includes a sum of distance $D_1$, distance $D_3$, distance $D_5$, and distance $D_6$.

Moreover if viewed from a top view perspective showing each of the MTJs include a substantially rectangular shape in FIG. 1, the critical dimension of each of the MTJs could include a length or width of the top electrode, a length or width of the free layer, a length or width of the barrier layer, a length or width of the pinned layer, or a length or width of the bottom electrode. Specifically, each of the MTJs could include a length extending along a first direction such as X-direction and a width extending along a second direction such as Y-direction orthogonal to the first direction. For instance, the first MTJ 14 includes a length $L_1$ and a width $W_1$, the second MTJ 16 includes a length $L_2$ and a width $W_2$, the third MTJ 18 includes a length $L_3$ and a width $W_3$, in which the length $L_1$ of the first MTJ 14 is less than the length $L_2$ of the second MTJ 16, the width $W_1$ of the first MTJ 14 is less than the width $W_2$ of the second MTJ 16, the length $L_2$ of the second MTJ 16 is less than the length $L_3$ of the third MTJ 18, and the width $W_2$ of the second MTJ 16 is less than the width $W_3$ of the third MTJ 18.

It should also be noted that even though only three MTJs are connecting to the sense amplifier 12 in this embodiment, it would also be desirable to adjust the number and size of the MTJs depending on the demand of the product. For instance, it would also be desirable to connect four, five, or even more than six MTJs to the sense amplifier 12 while the critical dimension of the MTJ closer to the sense amplifier 12 is less than the critical dimension of the MTJ farther from the sense amplifier 12.

Figure 2:
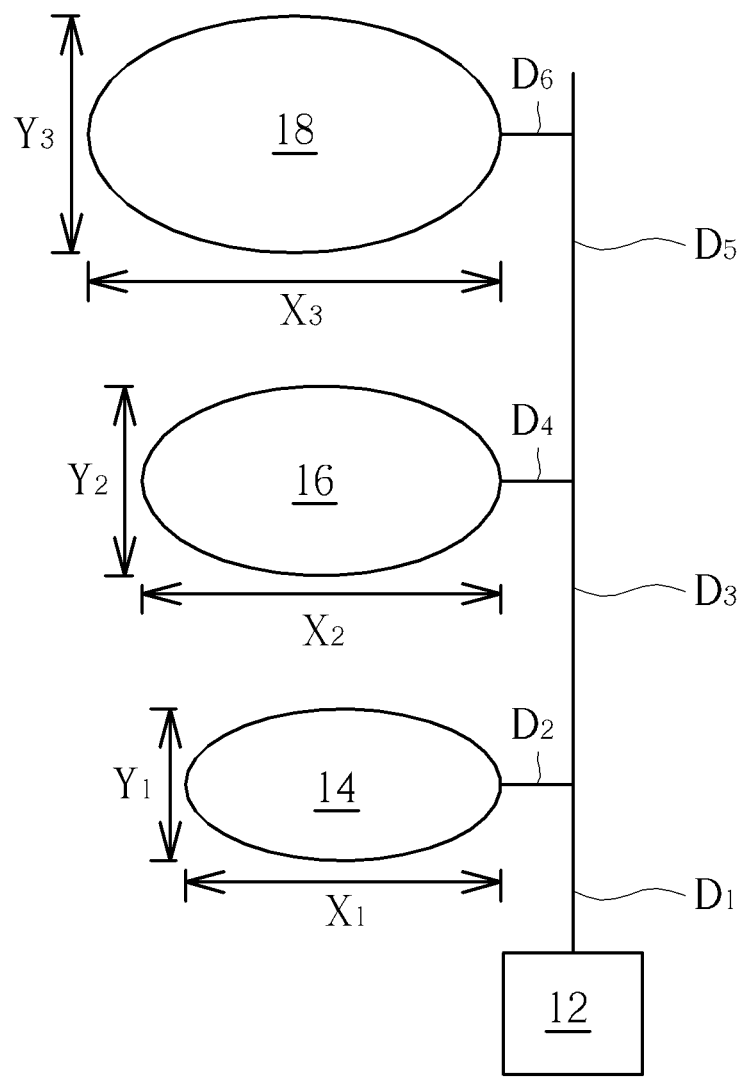
FIG. 2 illustrates a block diagram of a MRAM device according to an embodiment of the present invention.

Referring to FIG. 2, FIG. 2 illustrates a block diagram of a MRAM device according to an embodiment of the present invention. As shown in FIG. 2, in contrast to the MTJs from the aforementioned embodiment include rectangular profile under a top view perspective, it would also be desirable to adjust the shape of patterned mask during formation of MTJs through optical proximity correction (OPC) process for forming MTJs having substantially circular shapes including perfect circles, elliptical shapes, or flat oval shapes under top view perspective. As shown in FIG. 2, each of the MTJs including an ellipse under top view perspective could include a long axis extending along a first direction such as X-direction and a short axis extending along a second direction such as Y-direction orthogonal to the first direction. For instance, the first MTJ 14 includes a long axis $X_1$ and a short axis $Y_1$, the second MTJ 16 includes a long axis $X_2$ and a short axis $Y_2$, and the third MTJ 18 includes a long axis $X_3$ and a short axis $Y_3$.

Similar to the aforementioned embodiment, the distance between the MTJs and the sense amplifier is preferably inversely proportional to the critical dimension of each of the MTJs. For instance, the distance between the first MTJ 14 and the sense amplifier 12 is less than the distance between the second MTJ 14 and the sense amplifier 12 and the distance between the second MTJ 16 and the sense amplifier 12 is less than the distance between the third MTJ 18 and the sense amplifier 12. In the meantime, the critical dimension of the first MTJ 14 is less than the critical dimension of the second MTJ 16 and the critical dimension of the second MTJ 16 is less than the critical dimension of the third MTJ 18, in which the critical dimension of each MTJ in this instance could refer to the long axis or short axis of each of the MTJs under top view perspective.

As shown in FIG. 2, the distance (such as the first distance) between the first MTJ 14 and the sense amplifier 12 preferably includes a sum of distance $D_1$ and distance $D_2$, the distance (such as the second distance) between the second MTJ 16 and the sense amplifier 12 preferably includes a sum of distance $D_1$, distance $D_3$, and distance $D_4$, and the distance (such as the third distance) between the third MTJ 18 and the sense amplifier 12 preferably includes a sum of distance $D_1$, distance $D_3$, distance $D_5$, and distance $D_6$.

Moreover if viewed from a top view perspective showing each of the MTJs include a substantially circular or elliptical shape in FIG. 2, the critical dimension of each of the MTJs could include a long axis or short axis of the top electrode, a long axis or short axis of the free layer, a long axis or short axis of the barrier layer, a long axis or short axis of the pinned layer, or a long axis or short axis of the bottom electrode. Specifically, the long axis $X_1$ of the first MTJ 14 is less than the long axis $X_2$ of the second MTJ 16, the short axis $Y_1$ of the first MTJ 14 is less than the short axis $Y_2$ of the second MTJ 16, the long axis $X_2$ of the second MTJ 16 is less than the long axis $X_3$ of the third MTJ 18, and the short axis $Y_2$ of the second MTJ 16 is less than the short axis $Y_3$ of the third MTJ 18.

Typically, the critical dimension of the MTJs would differ depending on the magnetoresistance of each of the MTJs. For instance, MTJs having smaller critical dimension often induces an increase in MTJ resistance while MTJs having larger critical dimension lowers their resistance. In the meantime, a strong correlation is also observed between the sense amplifier and parasitic resistance of adjacent metal interconnections or metal wirings. For instance, lower parasitic resistance is typically found with metal interconnection closer toward the sense amplifier while higher parasitic resistance is found with metal interconnection farther away from the sense amplifier.

To compensate the difference between high and low parasitic resistances generated by metal routings around sense amplifier, the present invention preferably adjusts the critical dimension of each MTJ depending on the distance between the MTJs and the sense amplifier so that more stable read voltage could be obtained. For instance, it would be desirable to dispose an MTJ with smaller critical dimension closer to the sense amplifier while placing an MTJ with larger critical dimension farther away from the sense amplifier, in which the distance between the sense amplifier and MTJs could include the length of metal interconnection or metal routing physically or directly contacting the sense amplifier and the MTJ while the critical dimension of the MTJ could include any measurement parameters including lengths, widths, long axes, short axes, diameters, radii, and/or even circumferences of the MTJs depending on the shape of the MTJs under top view perspective.

According to experimental data, when the critical dimension or distance between MTJs is decreased by one nanometer an increase of 200 ohms in parasitic resistance is observed and to compensate this difference in parasitic resistance, the present invention preferably controls the critical dimension difference between the MTJ (such as the third MTJ) farthest from the sense amplifier and the MTJ (such as the first MTJ) closest to the sense amplifier to be between 3 nm to 6 nm or most preferably at 4 nm so that most stable read voltage could be obtained when a read operation is conducted on the sense amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a sense amplifier;
   a first magnetic tunneling junction (MTJ) connected to the sense amplifier at a first distance; and
   a second MTJ connected to the sense amplifier at a second distance, wherein the first distance is less than the second distance, a length of the first MTJ is less than a length of the second MTJ, and a width of the first MTJ is less than a width of the second MTJ.

2. The semiconductor device of claim 1, further comprising a third MTJ connected to the sense amplifier at a third distance.

3. The semiconductor device of claim 2, wherein the second distance is less than the third distance.

4. The semiconductor device of claim 2, wherein the length of the second MTJ is less than a length of the third MTJ.

5. The semiconductor device of claim 4, wherein a difference between the length of the first MTJ and the length of the third MTJ is between 3 nm to 6 nm.

* * * * *